United States Patent [19]

Trah et al.

[11] Patent Number: 5,282,926
[45] Date of Patent: Feb. 1, 1994

[54] METHOD OF ANISOTROPICALLY ETCHING MONOCRYSTALLINE, DISK-SHAPED WAFERS

[75] Inventors: Hans-Peter Trah, Reutlingen; Guenther Findler, Stuttgart, both of Fed. Rep. of Germany

[73] Assignee: Robert Bosch GmbH, Stuttgart, Fed. Rep. of Germany

[21] Appl. No.: 748,710

[22] Filed: Aug. 22, 1991

[30] Foreign Application Priority Data

Oct. 25, 1990 [DE] Fed. Rep. of Germany ....... 4033920
Feb. 28, 1991 [DE] Fed. Rep. of Germany ....... 4106287

[51] Int. Cl.⁵ .......................................... H01L 21/00
[52] U.S. Cl. .................................. 156/647; 156/662; 156/659.1; 156/657; 156/653
[58] Field of Search ............... 156/647, 657, 662, 653, 156/659.1

[56] References Cited

U.S. PATENT DOCUMENTS

| | | | |
|---|---|---|---|
| 3,728,179 | 4/1973 | Davidson et al. | 156/8 |
| 3,752,702 | 8/1973 | Iizuka | 156/647 |
| 4,549,926 | 10/1985 | Corboy et al. | 156/612 |
| 4,578,142 | 3/1986 | Corboy et al. | 156/612 |
| 4,581,928 | 4/1986 | Johnson | 156/647 |
| 4,585,513 | 4/1986 | Gale et al. | 156/630 |
| 4,658,495 | 4/1987 | Flatley | 29/571 |
| 4,698,132 | 10/1987 | Dennis | 156/657 |

FOREIGN PATENT DOCUMENTS

272704 10/1989 Fed. Rep. of Germany.
272737 10/1989 German Democratic Rep. .................................. 156/647

OTHER PUBLICATIONS

E. Bassous & E. F. Baran, "The Fabrication of High Precision Nozzles by the Anisotropic Etching of (100) Silicon", Journal of the Electrochemical Society, vol. 125, No. 8, pp. 1321-1327, Aug. 1978.

*Primary Examiner*—Tom Thomas
*Assistant Examiner*—George Goudreau
*Attorney, Agent, or Firm*—Frishauf, Holtz, Goodman & Woodward

[57] ABSTRACT

A method for anisotropically etching recesses in a monocrystalline disk-shaped wafer is proposed, by which structural elements such as membranes or through openings can be made in the wafer. To this end, a mask layer is applied to a first surface of the wafer and subsequently structured by making at least one opening in the mask layer. The dimensioning of the at least one opening, and its orientation with respect to the crystal orientation of the wafer and to the anisotropic properties of the wafer material, are selected such that the desired size and shape of the area of the recess or outlet hole are attained by anisotropic etching into the wafer through the at least one opening in the mask layer and by purposeful underetching of the mask layer.

3 Claims, 2 Drawing Sheets

METHOD OF ANISOTROPICALLY ETCHING MONOCRYSTALLINE, DISK-SHAPED WAFERS

Cross-references to related applications, assigned to the assignee of the present application, the disclosures of which are hereby incorporated by reference:

U.S. Ser. No. 07/701,781, BANTIEN, filed May 17, 1991, based on German Application P 40 16 471.3 of May 22, 1990 now U.S. Pat. No. 5,198,604 of Sep. 22, 1992;

U.S. Ser. No. 07/701,210, KIPPELT et al., filed May 16, 1991, based on German Application P 40 16 032.7 of May 18, 1990;

U.S. Ser. No. 07/724,142, ABENDROTH et al., filed Jul. 1, 1991, based on German Application P 40 21 056.1 of Jun. 29, 1990 now U.S. Pat. No. 5,153,395 of Oct. 6, 1992;

Cross-reference to other related patents

U.S. Pat. Nos. 4,549,926 and 4,578,142, CORBOY JR. et al/RCA;

U.S. Pat. No. 4,585,513, GALE et al/RCA, issued Apr. 29, 1986;

U.S. Pat. No. 4,658,495, FLATLEY & IPRI/RCA, issued Apr. 21, 1987;

U.S. Pat. No. 4,698,132, DENNIS/RCA, issued Oct. 6, 1987;

German Patent DE-PS 36 25 411, SEIDEL, Nov. 11, 1988, assigned to Messerschmidt-Bolkow-Blohm GmbH.

Cross-reference to related literature

Walter Kern, "Chemical Etching of Silicon, Germanium, Gallium Arsenide, and Gallium Phosphide", RCA REVIEW, June, 1978, Vol. 39, pp. 278-308.

FIELD OF THE INVENTION

The invention relates generally to a method for anisotropically etching monocrystalline, disk-shaped wafers to produce structural elements such as membranes or through openings, in which a mask layer is applied to a first surface of the wafer and structured, at least one opening is made in the mask layer, and an anisotropic etchant acts upon the wafer through the at least one opening in the mask layer.

Background

"The Fabrication of High Precision Nozzles by the Anisotropic Etching of (100) Silicon" by E. Bassous and E. F. Baran, published in the Journal of the Electrochemical Society, August, 1978, describes a method for producing nozzles, disposed in a grid pattern, with square openings for ink jet printers. The nozzles are produced by anisotropic etching of through holes in a monocrystalline silicon wafer with a (100) crystal orientation. To do so, etching into the wafer is done from one side, beginning at square openings in the etching mask, the edges of which openings are aligned parallel to two [110] directions located at right angles to one another in the (100) wafer surface. In this process, pyramidal etched indentations form, the lateral boundary walls of which have a (111) crystal orientation. These crystal planes are inclined by approximately 54.74° with respect to the (100) wafer surface. The square openings in the mask layer are dimensioned to suit the thickness of the wafer and this inclination angle of the (111) crystal planes relative to the (100) crystal planes, such that given an adequately long action by the anisotropic etchant, the silicon wafer is etched all the way through, and square outlet openings form on the underside of the wafer.

The Invention

The method of the invention as defined hereinafter has the advantage over the prior art that the packing density of holes disposed in a grid pattern can be increased, by exploiting the anisotropic properties of the wafer material and by purposeful underetching of the mask layer. The method can also be advantageously used in producing membranes. For structuring only a single through hole or only one membrane, the method of the invention is again advantageous, since comparatively little useful surface area of the monocrystalline wafer, namely the surface on which electronic circuits elements are for instance mounted, is lost in the process.

The method has other advantages and features as well. It proves to be favorable for the openings in the mask layer to be disposed such that etching it through the openings creates one recess per opening in the wafer, and that the recesses do not merge with one another upon underetching of the mask layer until the end of the etching process. This makes it simple to define the shape of the recesses produced in the wafer in etching. The method of the invention can be employed particularly advantageously on monocrystalline wafers having a (100) crystal orientation. Particularly in the structuring of membranes, it is advantageous to use the method of the invention on monocrystalline silicon wafers that have at least two layers, between which there is a dopant junction, such as a pn junction or a pp+ junction. Using the doping junction as an etching stop boundary for the deep etching is especially advantageous, because in this way decoupling of the vertical and lateral etching depths is attained. In contrast to the size of the membrane, which is defined by the duration of the etching action (lateral etching depth), the thickness of the membranes produced depends on the layer thicknesses of the silicon wafer, or on the depth at which the doping transition is located. To increase the packing density of apertured plates with rectangular outlet holes or arrays with rectangular membranes in (100) silicon, it is advantageous to make hexagonal openings in the mask layer, each with two parallel edges of the openings oriented parallel to one [100] direction located in the (100) wafer surface, while the other four edges of each opening are parallel to two [110] directions located at right angles to one another in the (100) wafer surface.

DRAWINGS

The drawings illustrate an exemplary embodiment of the invention, which is described in further detail below.

DETAILED DESCRIPTION

With the method of the invention, recesses or through holes in a wafer can be made in a simple way. One possible use of the method is to produce structural elements, such as through holes or membranes, that are disposed in a grid pattern and have identical geometric dimensions. It is often important to increase the packing density, or to provide for as little reduction as possible of the area of the wafer that can be used for other purposes, such as to accommodate electronic circuit elements. A monocrystalline disk-shaped substrate is used as the wafer. Structuring of this wafer is done by anisotropic etching. The method of the invention is especially suitable for structuring silicon wafers with a (100) crystal orientation. They may for example be either undoped, or doped uniformly. To produce certain structural elements, such as membranes, however, it is advantageous to use silicon wafers that have two differently doped layers, so that there is a doping junction between the layers, for instance a pn junction or a pp+ junction. This doping junction is used as an etching stop boundary for the depth etching, so that the depth of the etched recesses or the thickness of the membranes to be produced is in this case independent of the duration of the etching action. It is intrinsic to the invention, in structuring the etching mask, to take the crystallographic anisotropic properties of the wafer into account and to provide purposeful underetching of the mask layer.

Figure 1A:
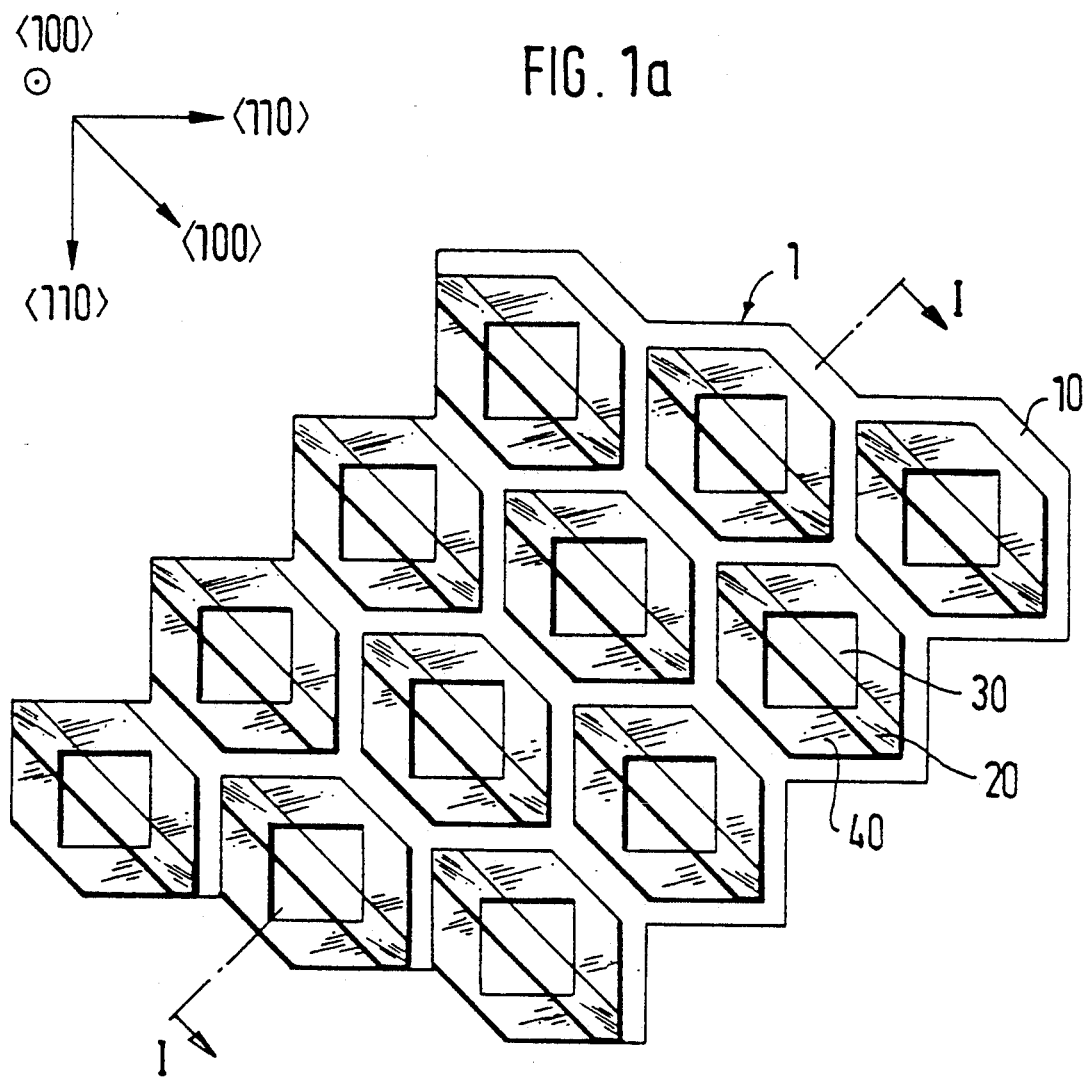
FIG. 1a shows an etching layout according to the invention for a (100) silicon wafer.
Figure 2:
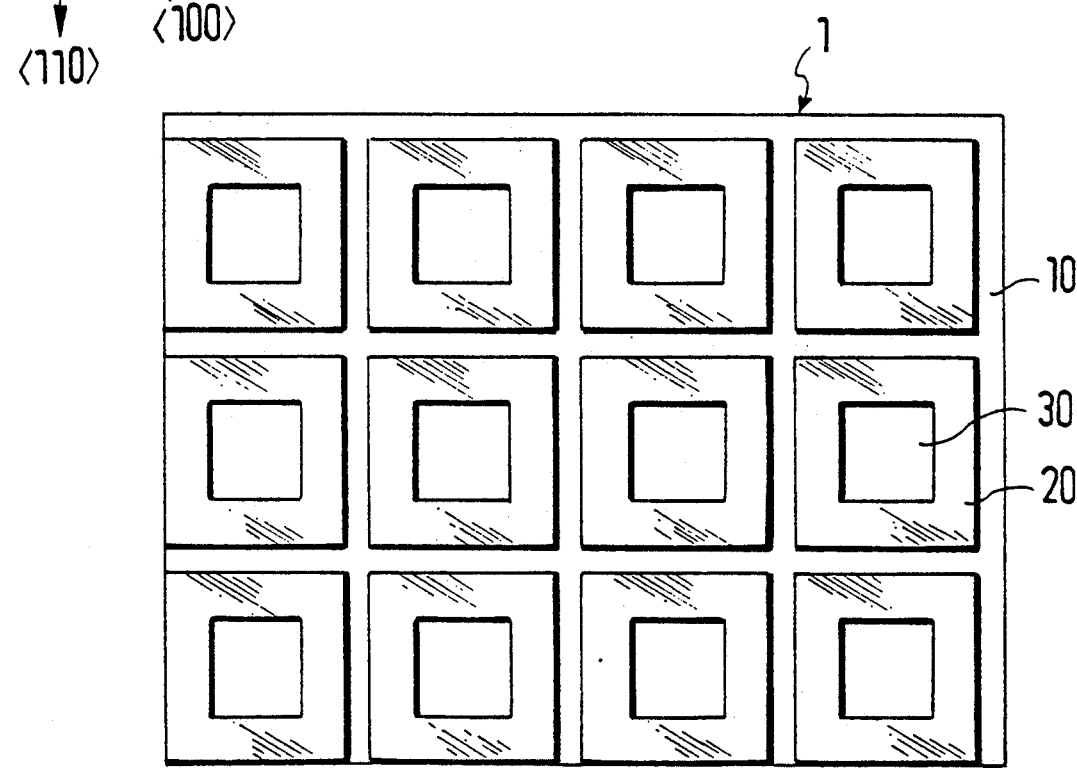
FIG. 2 shows a further etching layout for (100) silicon wafers according to the prior art.

For example, a method for producing apertured plates of (100) silicon wafers is described herein and compared with a method according to the prior art. In FIGS. 1a and 2, two different etching layouts are shown for this instance. The arrows in the upper left corner of FIGS. 1a and 2 indicate the crystal orientations of the silicon wafer, since an essential factor in the method of the invention is the orientation of the openings in the mask layer with respect to the crystal orientations of the wafer. To enable comparison of the space required for the two layouts for identical outlet opening shapes and an identical number of outlet openings 30, layouts in each case are shown having 12 square outlet openings 30.

For anisotropic etching of through holes in (100) silicon, the point of departure in the prior art is etching masks as shown in FIG. 2. The etching mask openings are identified by reference numeral 20. Because of the crystallographic angle of approximately 54.74° between the (100) silicon wafer surface and the stable (111) crystal planes defining the etching limits, the etching mask openings must be selected to be adequately large, depending on the desired depth of the recesses, or on the thickness of the silicon wafer, if through holes are to be etched. In FIG. 2, square etching mask openings have been selected, the edges of which are oriented parallel to two [100] directions located vertically of one another in the (100) wafer plane. The square etching mask openings must be selected as larger than the outlet openings 30, depending on the thickness of the silicon wafer. Upon etching through the etching mask openings 20, pyramidal recesses form, the areas of which are always square during the entire etching process. Purposeful underetching of the mask layer does not occur, since the orientation of the etching mask openings 20 is selected such that (111) crystal planes form immediately, as lateral boundary walls of the etched recesses.

If increasing the packing density of the through holes should be desired, then use can advantageously be made of the fact that given a suitable shape and orientation of the etching mask, space can be saved in the design by purposefully underetching this mask. Since the etching rate is of equal magnitude in all [100] directions, the underetching of the mask layer comes to have precisely the same magnitude as the etching depth, if the etching mask is oriented along the [100] directions. This kind of etching layout is shown in FIG. 1a. The etching mask openings 20 are hexagonal and in practical terms are segments of the square etching mask openings, shown in FIG. 2, along the diagonals of these squares. In other words, two parallel edges of each of the hexagonal etching mask openings 20 are aligned parallel to one [100] direction that is located in the (100) wafer surface. The other four edges of the etching mask openings 20 are oriented parallel to two [110] directions located vertically of one another in the (100) wafer surface, as shown in FIG. 2. The mask underetching is shown at 40. Given the orientation and dimensioning of the etching mask openings shown, anisotropic etching forms hexagonal recesses, which are bounded on only four sides by etching-limiting (111) planes, pairs of which each form a right angle. The remaining two sides walls of the recesses are defined by the duration of the etching action. In this way, an economy of approximately 11% in terms of space can be attained, by comparison with an etching layout shown in FIG. 2.

Figure 1B:
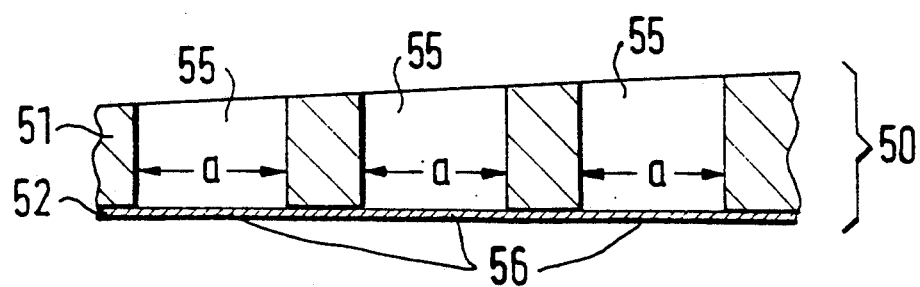
FIG. 1b is a section through a (100) silicon wafer that is etched by an etching layout of FIG. 1a; and for comparison.

In FIG. 1b, a section through a (100) silicon wafer (50) is shown, which is anisotropically etched in accordance with an etching layout as in FIG. 1a. The section extends along the axis I. The silicon wafer 50 in this example does not have the same thickness throughout; it is formed of a first layer 51, onto which a second layer 52 of defined thickness is applied. The two layers 51, 52 have different doping, so that there is a doping junction, for example a pn junction or a pp+ junction, between them. In the exemplary embodiment shown here, this junction was used as an etching stop boundary for the depth etching, and as a result the lateral etching depth is independent of the vertical etching depth. By this means, membranes 56 of defined thickness and the same diameter were produced, even though the silicon wafer 50 did not have a uniform thickness. The thickness of the membranes, when a doping junction is used as the etching stop limit, is largely independent of the duration of the etching action and corresponds to the thickness of the second layer 52. The size or diameter a of the membranes, conversely, is decisively dependent on the duration of the etching action. Since in the method of the invention the lateral etching depth is decoupled from the vertical etching depth, a plurality of structures having the same thickness and the same diameter can be produced even in silicon wafers that do not have a uniform thickness.

The utilization of the anisotropic properties of monocrystalline wafer substrates to produce structural elements in the orientation and dimensioning or structuring of etching masks for anisotropic etching in which the etching mask is purposefully underetched is not merely limited to monocrystalline silicon wafers with a (100) crystal orientation, but also includes monocrystalline substrates of kinds such that their anisotropic properties can be exploited in etching processes.

Various changes and modifications may be made, and features described in connection with any one of the embodiments may be used with any of the others, within the scope of the inventive concept.

We claim:

1. A method for anisotropically etching recesses in a monocrystalline, disk-shaped wafer with 100 crystal orientation, for producing structural elements therein, comprising the steps of
applying a mask layer onto a first surface of a wafer, structuring said mask layer to form an opening therein, and anisotropically etching said wafer through said opening (20) to form said recesses (30), wherein said recesses are produced with right-angle corners;

each mask layer opening (20) is cross-sectionally hexagonal;

two parallel edges, of each hexagonal opening (20), are oriented parallel to a 100-direction of said wafer surface; and the remaining four edges of each hexagonal opening (20) are oriented parallel to two mutually orthogonal 110-directions of said wafer.

2. The method of claim 1, wherein a plurality of openings (20) are disposed in a grid pattern, and that upon etching through the openings (20), one recess (30) is created in the wafer per opening (20), and the recesses do not merge with one another upon underetching of the mask layer.

3. The method of claim 1, wherein the monocrystalline silicon wafer (50) serving as the wafer has at least two layers (51, 52), between which there is at least one doping junction, preferably a pn junction or a pp+ junction, and the at least one doping junction serves as an etching stop boundary for depth etching.

* * * * *